United States Patent [19]

Byatt

[11] Patent Number: 5,359,210
[45] Date of Patent: Oct. 25, 1994

[54] INTEGRATED CIRCUIT

[75] Inventor: Stephen W. Byatt, Bromham, United Kingdom

[73] Assignee: Texas Instruments Incorporated, Dallas, Tex.

[21] Appl. No.: 966,932

[22] Filed: Oct. 27, 1992

[30] Foreign Application Priority Data

Jan. 24, 1992 [GB] United Kingdom ............... 9201820

[51] Int. Cl.$^5$ ............................................. H01L 29/74
[52] U.S. Cl. ....................................... 257/109; 257/107
[58] Field of Search ................................ 257/107, 109

[56] References Cited

U.S. PATENT DOCUMENTS

| 4,112,458 | 9/1978 | Jaskolski et al. | 257/109 |
| 4,400,712 | 8/1983 | O'Connor | 357/44 |
| 4,868,703 | 9/1989 | Borkowicz | 361/58 |
| 5,036,377 | 7/1991 | Pathak et al. | 357/38 |

FOREIGN PATENT DOCUMENTS

| 341000 | 11/1989 | European Pat. Off. | 257/107 |
| 2329398 | 12/1973 | Fed. Rep. of Germany | 257/107 |
| 3421185 | 12/1985 | Fed. Rep. of Germany | 257/107 |
| 4024526 | 2/1991 | Fed. Rep. of Germany | H01L 29/747 |
| 0438700 | 7/1991 | Fed. Rep. of Germany | H01L 29/747 |
| 2310636 | 12/1976 | France | 257/107 |
| 2566582 | 12/1985 | France | 257/109 |
| 0167440 | 1/1986 | France | H01L 29/747 |
| 57-84175 | 5/1982 | Japan | 257/107 |
| 3132071 | 6/1991 | Japan | 257/109 |
| WO9104579 | 4/1991 | PCT Int'l Appl. | H01L 29/747 |
| 2184884 | 1/1988 | United Kingdom | H01L 29/747 |
| 2205685 | 12/1988 | United Kingdom | H01L 29/747 |

OTHER PUBLICATIONS

Patent Abstracts of Japan-vol. 9, No. 140 (E-321) (1863) 14 Jun. 1985 & JP-A-60 021 570 (Hitachi Seisakusho K.K.) 2 Feb. 1985.

Patent Abstracts of Japan-vol. 13, No. 445 (E-829) (3793) 6 Oct. 1989 & JP-A-11 71 273 (Fuji Electric Co Ltd) 6 Jul. 1989.

*Primary Examiner*—Andrew J. James
*Assistant Examiner*—Stephen D. Meier
*Attorney, Agent, or Firm*—Russell E. Baumann; Richard L. Donaldson; Rene' E. Grossman

[57] ABSTRACT

An integrated circuit including a first device having respective input and output electrodes at opposed first and second faces of a semiconductor block in which the device is formed, and a second device, formed in the semiconductor block, having its respective input and output electrodes at the first and second faces of the semiconductor block, the electrodes at the first face of the semiconductor block intermingling with each other. In one form of the integrated circuit, the electrode of the first device at the first face of the semiconductor block includes a plurality of discrete contact areas distributed over substantially all of the first face, and the electrode of the second device at the first face includes a contact area which lies between the discrete contact areas.

15 Claims, 1 Drawing Sheet

INTEGRATED CIRCUIT

BACKGROUND OF THE INVENTION

The present invention relates to an integrated circuit which includes two devices formed in a semiconductor block.

The present invention provides an integrated circuit including a first device having respective input and output electrodes at opposed first and second faces of a semiconductor block in which the device is formed, and a second device, formed in the semiconductor block, having its respective input and output electrodes at the first face and at the second face of the semiconductor block, the electrodes at the first face of the semiconductor block intermingling with each other as the electrode of the first device at the first face of the semiconductor block having a plurality of discrete contact areas distributed over the first face of the semiconductor block, and the electrode of the second device at the first face of the semiconductor block includes a contact area lying between the discrete contact areas of the electrode of the first device.

The electrode of the first device at the first face may, for example, include a plurality of discrete contact areas at respective positions corresponding to the dark areas on a chess board, with the electrode of the second device at the first face including contact areas occupying the positions corresponding to the white areas on the chess board.

The intermingling of the electrodes contrasts with the known arrangement of having each electrode concentrated in a respective part of the first face of the semiconductor block.

Preferably, the electrode of the first device at the first face of the semiconductor block includes a plurality of discrete contact areas distributed over substantially all of the first face of the semiconductor block, and the electrode of the second device at the first face of the semiconductor block includes a contact area lying between the discrete contact areas of the electrode of the first device.

Preferably, the electrodes at the first face of the semiconductor block have a common surface within the semiconductor block, and the electrode of the first device at the first face has a plurality of projections which extend through the electrode of the second device at the first face and terminate at the surface of the first face.

Preferably, the electrodes at the second face of the semiconductor block intermingle with each other.

Preferably, the contact areas at the second face of the semiconductor block are similar in shape to the respective contact areas at the first face.

Preferably, the input electrode of the first device and the output electrode of the second device lie at the first face of the semiconductor block.

Preferably, the first device includes an intermediate electrode, which sets its breakdown voltage, between its input and output electrodes, and that intermediate electrode has a form similar to the form of the electrode of the first device at the first face of the semiconductor block.

Preferably, the second device includes an intermediate electrode, which sets its breakdown voltage, between its input and output electrodes, and that intermediate electrode has a form similar to the form of the electrode of the second device at the first face of the semiconductor block.

Preferably, the first device is a PNPN device and, preferably, the second device is a PNPN device, and the input electrode of the first device and the output electrode of the second device lie at the first face of the semiconductor block.

DESCRIPTION OF THE DRAWINGS

An integrated circuit in accordance with the invention will now be described, by way of example only, with reference to the accompanying drawings in which.

DESCRIPTION OF THE PREFERRED EMBODIMENTS

In the following description the terms "upper" and "lower" refer to the device as viewed in the accompanying drawings.

Figure 1:
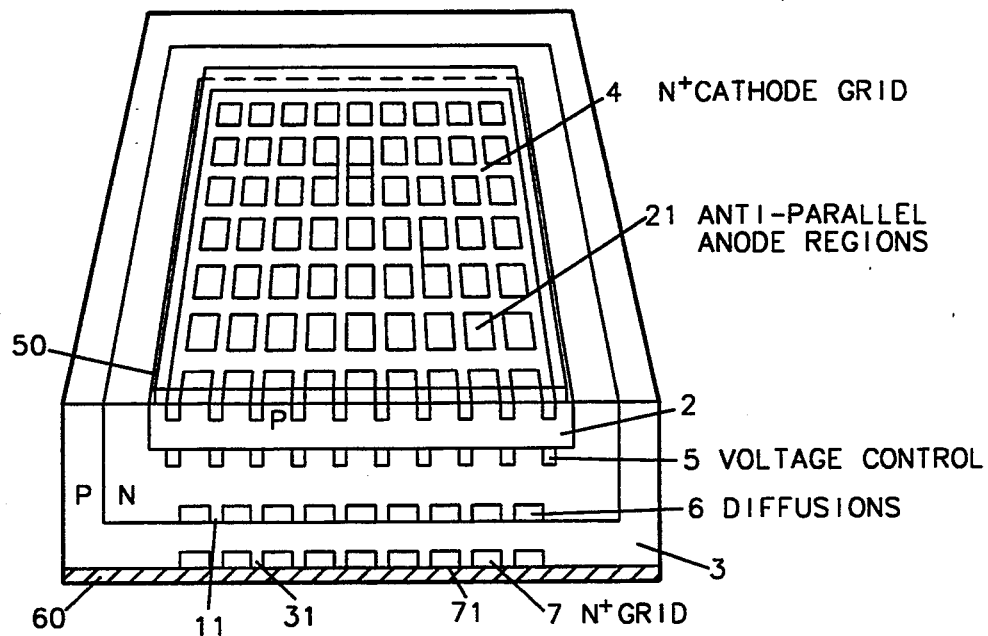
FIG. 1 shows a perspective view of the internal structure of a first example of the integrated circuit.

Referring to FIG. 1 of the accompanying drawings, the first example of the integrated circuit included an inner N-type semiconductor body 1 having substantially rectangular upper and lower faces. An inner P-type semiconductor body 2 has a lower face in contact with the upper face of the inner N-type body 1, and an upper face which is in contact with a first outer N-type semiconductor body 4. The first outer N-type semiconductor body 4 consists of a plurality of longitudinal and traverse bars of N-type semiconductor material which form a grid, and each of the bars has an exposed upper face. The inner, P-type body 2 extends upwards into the gaps between the bars which form the first outer N-type body 4 and consequently, the upper face of the inner P-type body 2 consists of a plurality of substantially rectangular areas which are separated by the bars forming the first outer N-type body 4.

The lower face of the inner N-type body 1 has the upper face of an outer P-type body 3 adjacent to it. A second outer N-type body 7 lies in the lower surface of the outer P-type body 3; the second outer N-type body 7 consists of a plurality of substantially rectangular blocks. The blocks are separated from one another by a plurality of longitudinal and transverse bars 31 on the lower face of the outer P-type body 3 and those bars form a grid which has the same pitch as the grid formed by the bars which make up the first outer N-type body 4. Also, the relative positions and shapes of the blocks are substantially the same as the relative positions and shapes of those regions of the inner P-type body 2 which extend into the gaps between the bars forming the first outer N-type body 4.

The inner N-type body 1 has a first additional N-type formation 5 consisting of a plurality of longitudinal and transverse bars at relative positions and of sizes substantially the same as the relative positions and sizes of the bars of the first outer N-type body 4. The formation 5 is of N-type semiconductor material of higher conductivity than that of the inner N-type body 1 and is located at the upper face of the inner N-type body 1. In addition, the inner N-type body 1 has a second additional formation 6 consisting of a plurality of substantially rectangular blocks at substantially the same relative positions and of substantially the same shape as the blocks of the second outer N-type body 7. The second additional formation 6 is of N-type semiconductor material of higher conductivity than that of the inner N-type body 2 and is located at the lower face of the inner N-type body 1.

The inner P-type body 2, the inner N-type body 1, the outer P-type body 3, and the second outer N-type body 7 form a first PNPN device which has the second additional formation 6 at the junction of the inner N-type body 1 and the outer P-type body 3.

The outer P-type body 3, the inner N-type body 1, the inner P-type body 2, and the first outer N-type body 4, form a second PNPN device, facing opposite to the first PNPN device, which has the first additional formation 5 at the junction of the inner N-type body 1 and the inner P-type body 2.

The inner P-type body 2 and the second outer N-type body 7 are the input and output contact areas for the electrodes of the first PNPN device, while the outer P-type body 3 and the first outer N-type body 4 are the input and output contact areas for the electrodes of the second PNPN device. The inner P-type body 2 and the first outer N-type body 4 are connected together by means of a metal layer 50 as electrode formed on the common surface of those two bodies, and the second N-type body 7 and the outer P-type body 3 are connected together by means of another metal layer 60 as electrode formed on the common surface of those two bodies, providing two PNPN devices connected in parallel in opposite senses.

In the operation of the integrated circuit, current flow occurs from the top surface to the bottom surface of the semiconductor block through the first PNPN device, and current flow in the opposite sense occurs through the second PNPN device. Current flow through the first PNPN device is concentrated in columns having the areas 21 of the inner P-type body 2 and the areas 71 of the second outer N-type body 7 as their upper and lower faces. Those columns of current are distributed over the semiconductor block in accordance with the distribution of the areas 21 and 71 over the semiconductor block, and as a result of the distribution of the current columns, the heating effect of the current through the first PNPN device is distributed substantially throughout the semiconductor block. The current through the second PNPN device flows in the semiconductor material between the columns defined by the areas 31 and 4 and the heating effect of that current is also distributed substantially throughout the semiconductor block.

Referring to FIG. 1, the integrated circuit is a two-terminal device. For clarity, terminals are not shown, but consist of a conductive layer on its upper surface and a conductive layer on its lower surface. The provision of a single conductive upper layer and a single conductive lower layer results in an integrated circuit consisting of two devices which are connected in parallel with each other and conductive in opposite senses.

Alternatively, it would be possible to provide separate terminals for the two devices which make up the integrated circuit; that is, the integrated circuit may be a four-terminal device.

The integrated circuit shown in FIG. 1, when provided with a single upper and single lower conductive layer, consists of two substantially identical PNPN devices connected in parallel in opposite senses. The body 5 sets the breakdown voltage of the first device, and the body 6 sets the breakdown voltage of the second device. The width of the grid is such that it provides an effect equivalent to shorting dots used in conventional devices.

The integrated circuit shown in FIG. 1, when provided with only two terminals, can be used as a bidirectional transient voltage suppressor. Since the current for each device is dispersed through the semiconductor bulk, the heat generated by each device is spread over the volume of the semiconductor bulk and the resulting temperature rise is less than that for the conventional arrangement of the bidirectional device, having the PNPN devices side-by-side. It would be the case that, in the use of the integrated circuit as a transient voltage suppressor, one of the two PNPN devices is activated more often than the other, and the temperature rise of the integrated circuit is substantially less than it would be for a conventional device with side-by-side PNPN devices. The integrated circuit with intermingled electrodes provides a transient voltage suppressor with a high surge current rating that a conventional side-by-side device having the same volume.

Figure 2:
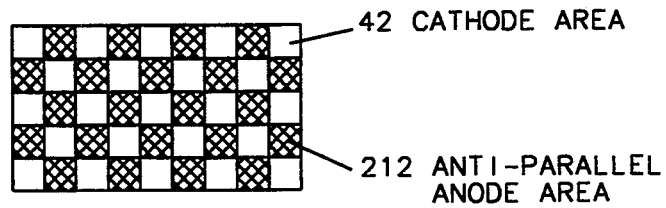
FIG. 2 shows one electrical contact surface of a second example of the integrated circuit.

FIG. 2 shows a first alternative arrangement of the upper surfaces of the inner P-type body 2 and the first outer N-type body 4 of the integrated circuit, as seen from directly above. As shown in FIG. 2, the upper surface of the inner P-type body 2 consists of a plurality of rectangular areas and each corner of each rectangular area touches a respective corner of the immediately adjacent rectangular areas as do the dark and light areas of a chess-board. The surface of the first outer N-type body 4 consists also of a plurality of rectangular areas and occupy the spaces among the rectangular areas of the inner P-type body 2. The lower surface of the outer P-type body 3 is substantially the same as the upper surface of the first outer N-type body 4, and the lower surface of the N-type body 7 is substantially the same as the upper surface of the inner P-type body 2.

Figure 3:
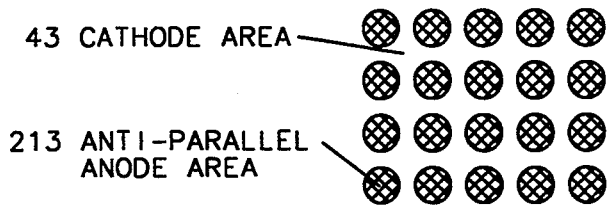
FIG. 3 shows the electrical contact surface corresponding to that shown in FIG. 2 for a third example of the integrated circuit.

FIG. 3 shows a second alternative arrangement of the upper surfaces of the inner P-type body 2 and the first outer N-type body 4 of the integrated circuit, as seen from directly above. As shown in FIG. 3, the upper surface of the inner P-type body 2 consists of a plurality of circular areas which are separated from one another by the material of the first outer N-type body 4. The circular areas are set out with their centers on a regular rectangular grid.

Figure 4:
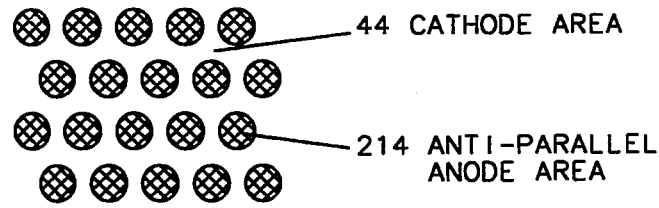
FIG. 4 shows the electrical contact surface corresponding to that shown in FIG. 2 for a fourth example of the integrated circuit.

FIG. 4 shows a variation of the second alternative arrangement of the upper surfaces of the inner P-type body 2. In the variation of the alternative arrangement, the centers of the circular areas are set out with their centers on a regular rhomboid grid.

Further alternatives for the electrical contact surfaces of the inner P-type body 2 and the first outer N-type body 4 are spiral, interdigitated and annular shapes. The same alternatives exist for the shapes of the regions making up the lower surface of the device.

The integrated circuit described above is capable of performing the functions of a transient voltage suppressor for a single pair of lines which are connected to respective ones of its faces, and protection for a plurality of pairs of lines may be provided by means of a semiconductor block into which are integrated a plurality of substantially identical circuits. Also, transient voltage suppressor can include a plurality of the semiconductor blocks in one package and those semiconductor blocks may each comprise a single circuit as described above or a plurality of those circuits.

I claim:

1. An integrated circuit including a first device having respective input and output electrodes at opposed first and second faces of a semiconductor block in which the device is formed, and a second device, formed in the semiconductor block, having its respective input and output electrodes at the first face and at the second face of the semiconductor block, the electrodes at the first face of the semiconductor block intermingling with each other so that the electrode of the first device at the first face of the semiconductor block includes a plurality of discrete contact areas distributed over the first face of the semiconductor block, and the electrode of the second device at the first face of the semiconductor block includes a contact area lying between the discrete contact areas of the electrode of the first device.

2. An integrated circuit as claimed in claim 1 wherein the electrodes at the first face of the semiconductor block have a common surface within the semiconductor block, and the electrode of the first device at the first face has a plurality of projections which extend through the electrode of the second device at the first face and terminate at the surface of the first face.

3. An integrated circuit as claimed in claim 1 wherein the electrode at the second face of the semiconductor block intermingle with each other.

4. An integrated circuit as claimed in claim 3 wherein the contact areas of the electrodes at the second face of the semiconductor block are similar in shape to the respective contact areas of the electrodes at the first face.

5. An integrated circuit as claimed in claim 1 wherein the input electrode of the first device and the output electrode of the second device lie at the first face of the semiconductor block.

6. An integrated circuit as claimed in claim 5 wherein the first device includes an intermediate electrode which controls breakdown voltage and is positioned between its input and output electrodes, said intermediate electrode having a configuration similar to the configuration of the electrode of the first device at the first face of the semiconductor block.

7. An integrated circuit as claimed in claim 6 wherein the second device includes an intermediate electrode, which controls its breakdown voltage and is positioned between its input and output electrodes, said intermediate electrode having a configuration similar to the configuration of the electrode of the second device at the first face of the semiconductor block.

8. An integrated circuit as claimed in claim 7 wherein the first device is a PNPN device.

9. An integrated circuit as claimed in claim 8 wherein the second device is a PNPN device, the input electrode of the first device and the output electrode of the second device lying at the first face of the semiconductor block.

10. An integrated circuit as claimed in claim 1 wherein said discrete contact areas are in the shape of a rectangle.

11. An integrated circuit as claimed in claim 1 wherein said discrete contact areas are in the shape of a circle.

12. An integrated circuit as claimed in claim 1 wherein said discrete contact areas of said first and second devices are arranged like the dark and light areas of a chessboard.

13. A semiconductor block including a plurality of integrated circuits as claimed in claim 1.

14. A transient voltage suppressor including an integrated circuit as claimed in claim 1 in a package.

15. A transient voltage suppressor including a semiconductor block as claimed in claim 1 in a package.

* * * * *